United States Patent
DeGrood

(10) Patent No.: US 8,428,920 B2
(45) Date of Patent: Apr. 23, 2013

(54) METHODS AND SYSTEMS FOR DYNAMIC WRINKLE PREDICTION

(75) Inventor: Kevin B. DeGrood, Livonia, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 506 days.

(21) Appl. No.: 12/704,996

(22) Filed: Feb. 12, 2010

(65) Prior Publication Data

US 2011/0202325 A1 Aug. 18, 2011

(51) Int. Cl.
G06F 17/50 (2006.01)
G06F 7/60 (2006.01)
G06F 17/10 (2006.01)
G06G 7/48 (2006.01)

(52) U.S. Cl.
USPC .................. 703/6; 703/1; 703/2; 703/8

(58) Field of Classification Search .......... 703/6
See application file for complete search history.

(56) References Cited

U.S. PATENT DOCUMENTS

| | | | |
|---|---|---|---|
| 5,942,695 A | 8/1999 | Verma et al. | |
| 6,201,546 B1 * | 3/2001 | Bodor et al. | 345/620 |
| 6,609,408 B2 * | 8/2003 | Chen et al. | 73/7 |
| 6,633,830 B2 * | 10/2003 | Chen et al. | 702/155 |
| 6,736,017 B2 * | 5/2004 | Mansky | 73/862.046 |
| 6,842,532 B2 * | 1/2005 | Hu et al. | 382/111 |
| 6,968,297 B1 * | 11/2005 | Ziakovic et al. | 703/1 |
| 7,158,922 B2 * | 1/2007 | Sadagopan et al. | 703/2 |
| 7,386,429 B1 * | 6/2008 | Fujisaki | 703/6 |
| 7,440,874 B2 * | 10/2008 | Durney et al. | 703/1 |
| 7,447,614 B2 * | 11/2008 | Ghaboussi et al. | 703/2 |
| 7,552,646 B1 | 6/2009 | DeGrood | |
| 7,567,849 B1 * | 7/2009 | Trammell et al. | 700/97 |
| 7,601,978 B2 * | 10/2009 | Sari-Sarraf et al. | 250/559.08 |
| 7,634,394 B2 * | 12/2009 | Macura et al. | 703/6 |
| 7,672,816 B1 * | 3/2010 | Kulkarni et al. | 703/2 |
| 8,170,842 B2 * | 5/2012 | Ognjanovic | 703/2 |
| 2003/0033113 A1 | 2/2003 | Chen et al. | |
| 2003/0047013 A1 | 3/2003 | Chen et al. | |
| 2004/0135355 A1 | 7/2004 | Selig et al. | |
| 2005/0080604 A1 * | 4/2005 | Ko et al. | 703/6 |
| 2005/0102109 A1 * | 5/2005 | Dubois et al. | 702/39 |

(Continued)

OTHER PUBLICATIONS

Decaudin et al. "Virtual Garments: A Fully Geometric Approach for Clothing Design", EUROGRAPHICS 2006 vol. 25 (2006), No. 3.*

(Continued)

Primary Examiner — Shambhavi Patel
(74) Attorney, Agent, or Firm — Dinsmore & Shohl LLP

(57) ABSTRACT

Systems and methods for predicting a dynamic wrinkle property are provided. In one embodiment, a method of predicting a dynamic wrinkle property of a material for incorporation with an upholstered article includes selecting a plurality of material property categories and determining a material property for each selected material property category of a material. A dynamic wrinkle factor is assigned for each material property category based at least in part on the material property associated with the material property category. A dynamic wrinkle weight value is applied to each dynamic wrinkle factor to generate a weighted dynamic wrinkle factor for each material property category. The method further includes determining a predicted dynamic wrinkle score based at least in part on the weighted dynamic wrinkle factors and altering one or more material properties of the material if the predicted dynamic wrinkle score is below a benchmark value.

20 Claims, 2 Drawing Sheets

U.S. PATENT DOCUMENTS

| | | | | |
|---|---|---|---|---|
| 2005/0264562 | A1* | 12/2005 | Macura et al. | 345/420 |
| 2005/0267614 | A1* | 12/2005 | Looney et al. | 700/98 |
| 2005/0267615 | A1* | 12/2005 | Lavash et al. | 700/98 |
| 2006/0036410 | A1 | 2/2006 | Pan | |
| 2007/0194606 | A1* | 8/2007 | Yeomans | 296/210 |
| 2007/0239409 | A1* | 10/2007 | Alan | 703/2 |
| 2008/0163344 | A1* | 7/2008 | Yang | 726/4 |
| 2009/0012749 | A1* | 1/2009 | Ornjanovic | 703/1 |
| 2009/0146995 | A1* | 6/2009 | Van Bael et al. | 345/419 |
| 2009/0183563 | A1 | 7/2009 | DeGrood | |
| 2009/0278843 | A1* | 11/2009 | Evans | 345/419 |

OTHER PUBLICATIONS

Liu et al. "Material Characterization Based on Instrumented and Simulated Indentation Tests", International Journal of Applied Mechanics vol. 1, No. 1 (2009) 61-84.*

Jing et al. "Modeling wrinkles on smooth surfaces for footwear design", Computer-Aided Design 37 (2005) 815-823.*

Matsudaira et al. "Changes in Dynamic Drapability of Polyester Fabrics with Weave Density, Yarn Twist and Yarn Count Obtained by Regression Equations", Indian Journal of Fibre & Textile Research, vol. 33, Sep. 2008, pp. 223-229.*

Mohammed et al. "Experimental studies and analysis of the draping of woven fabrics", Composites: Part A 31 (2000) 1409-1420.*

Ng et al. "Analysis of Fabric Drape and Garment Drape", RJTA vol. 6 No. 2.*

Bridson et al. "Simulation of Clothing with Folds and Wrinkles", Eurographics/SIGGRAPH Symposium on Computer Animation (2003).*

Potluri et al. "Comprehensive Drape Modeling for Moulding 3D Textile Preforms", Composites: Part A 32 (2001) 1415-1424.*

Tang et al. "Modeling Developable Folds on a Strip", Journal of Computing and Information Science in Engineering Mar. 2005, vol. 5 No. 35.*

\* cited by examiner

METHODS AND SYSTEMS FOR DYNAMIC WRINKLE PREDICTION

TECHNICAL FIELD

Embodiments described herein generally relate to dynamic wrinkle prediction and, more particularly, to methods and systems for predicting dynamic wrinkle properties in materials used on upholstered articles.

BACKGROUND

Upholstered articles, such as vehicle seats for motor vehicles, may include a structural frame, padding, and a cover. During the life of a motor vehicle, for example, various forces may be exerted on the vehicle seat. A passenger or driver may exert forces on a vehicle seat while sitting in the seat, getting in and out of a seat, or when the vehicle performs maneuvers.

In the early stages vehicle development, a material may be selected for a seat cover before a final seat design is determined. The material may be preliminarily tested and appear to be satisfactory for a seat cover. For example, a material may pass other material property standards but then later fail a dynamic wrinkling evaluation. Changes to a material selection in the final stages of vehicle development may cause significant production delays, re-design of the seats, additional costs or other inefficiencies in the manufacturing process. Because each passenger or driver may have a different size, weight, weight distribution, and shape, it may be difficult to predict the variety of forces that may be exerted on the vehicle seat.

Accordingly, a need exists for alternative material design methods.

SUMMARY

In one embodiment, a method of predicting a dynamic wrinkle property of a material for incorporation with an upholstered article includes selecting a plurality of material property categories and determining a material property for each selected material property category of a material. A dynamic wrinkle factor is assigned for each material property category based at least in part on the material property associated with the material property category. A dynamic wrinkle weight value is applied to each dynamic wrinkle factor to generate a weighted dynamic wrinkle factor for each material property category. The method further includes determining a predicted dynamic wrinkle score based at least in part on the weighted dynamic wrinkle factors and altering one or more material properties of the material if the predicted dynamic wrinkle score is below a benchmark value.

In another embodiment, a method of designing a material of an upholstered article includes providing a material and predicting a dynamic wrinkle property of the material by performing a dynamic wrinkle property prediction analysis. The dynamic wrinkle property prediction analysis includes selecting two or more material property categories from a plurality of material property categories associated with the material and determining a material property for each selected material property category. The analysis further includes applying a dynamic wrinkle factor for each selected material property category based at least in part on the material property associated with the selected material property category, applying a dynamic wrinkle weight value to each dynamic wrinkle factor to generate a weighted dynamic wrinkle factor for each selected material property category, and determining a predicted dynamic wrinkle score based at least in part on the weighted dynamic wrinkle factors. The predicted dynamic wrinkle score is compared with a predicted dynamic wrinkle score benchmark value. If the predicted dynamic wrinkle score is less than the predicted dynamic wrinkle score benchmark value, one or more of the material properties may be altered and the dynamic wrinkle property prediction analysis may be repeated. If the predicted dynamic wrinkle score is greater than or equal to the predicted dynamic wrinkle score benchmark value, the material may be selected for further processing.

In yet another embodiment, a dynamic wrinkle prediction system includes a processor, a graphical display and a memory. The memory includes a set of executable instructions that are operable to cause the processor to: receive a plurality of material properties associated with a material, the plurality of material properties corresponding to a plurality of material property categories; assign a dynamic wrinkle factor for each material property category based at least in part on the material property associated with the material property category; apply a dynamic wrinkle weight value to each dynamic wrinkle factor to generate a weighted dynamic wrinkle factor for each material property category; determine a predicted dynamic wrinkle score based at least in part on the weighted dynamic wrinkle factors; and display the predicted dynamic wrinkle score on the graphical display.

These and additional features provided by the embodiments described herein will be more fully understood in view of the following detailed description.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

As described herein, embodiments may be utilized to predict the results of a dynamic wrinkle evaluation test that may occur in a design process. Dynamic wrinkles are wrinkles that are formed in a material such as fabric with the application of a force or load. During development of a material (e.g., a fabric) for use in a vehicle seat, designers may make material selections based on properties such as material color, material construction, fabric scrim, pile, etc. Although the selected material may pass evaluations in testing the materials for the aforementioned properties (as well as other material properties), the material may wrinkle when evaluated on an actual vehicle seat. Such an evaluation may occur late in the design process and leave very limited time to make corrections. Therefore, a prediction of how a material having a plurality of material properties will perform during the late-stage dynamic wrinkle evaluation test may be very beneficial to designers. Designers may use the dynamic wrinkle prediction methods and systems of the embodiments described herein to alter the material properties of the material well in advance of the actual dynamic wrinkle evaluation test until they are comfortable that they have designed a material that will pass such a test.

Generally, embodiments include a plurality of material properties in corresponding material property categories for predicting the dynamic wrinkle property of materials. A dynamic wrinkle factor is assigned to each material property category based on the corresponding material property. Each material property may affect the dynamic wrinkle property of the material differently. Therefore, dynamic wrinkle weight values are applied to the assigned dynamic wrinkle factors to generate weighted dynamic wrinkle factors. Because the material properties may work with and/or against one another in generating or preventing wrinkles, embodiments described herein do not consider only one material property in the dynamic wrinkle property prediction analysis. Rather, the systems and methods described herein predict the dynamic wrinkle property of the material by considering all of the weighted dynamic wrinkle factors in total to generate a predicted dynamic wrinkle score. If the predicted dynamic score is above a benchmark value, then the material may be considered suitable as a material for the upholstered article. If the predicted dynamic wrinkle score is below the benchmark value, the designers may alter the material properties to eventually design a material that has a predicted dynamic wrinkle score that is above the benchmark value. Methods and systems for designing a material for an upholstered article and predicting a dynamic wrinkle property of a material will be described in more detail herein.

Figure 1:
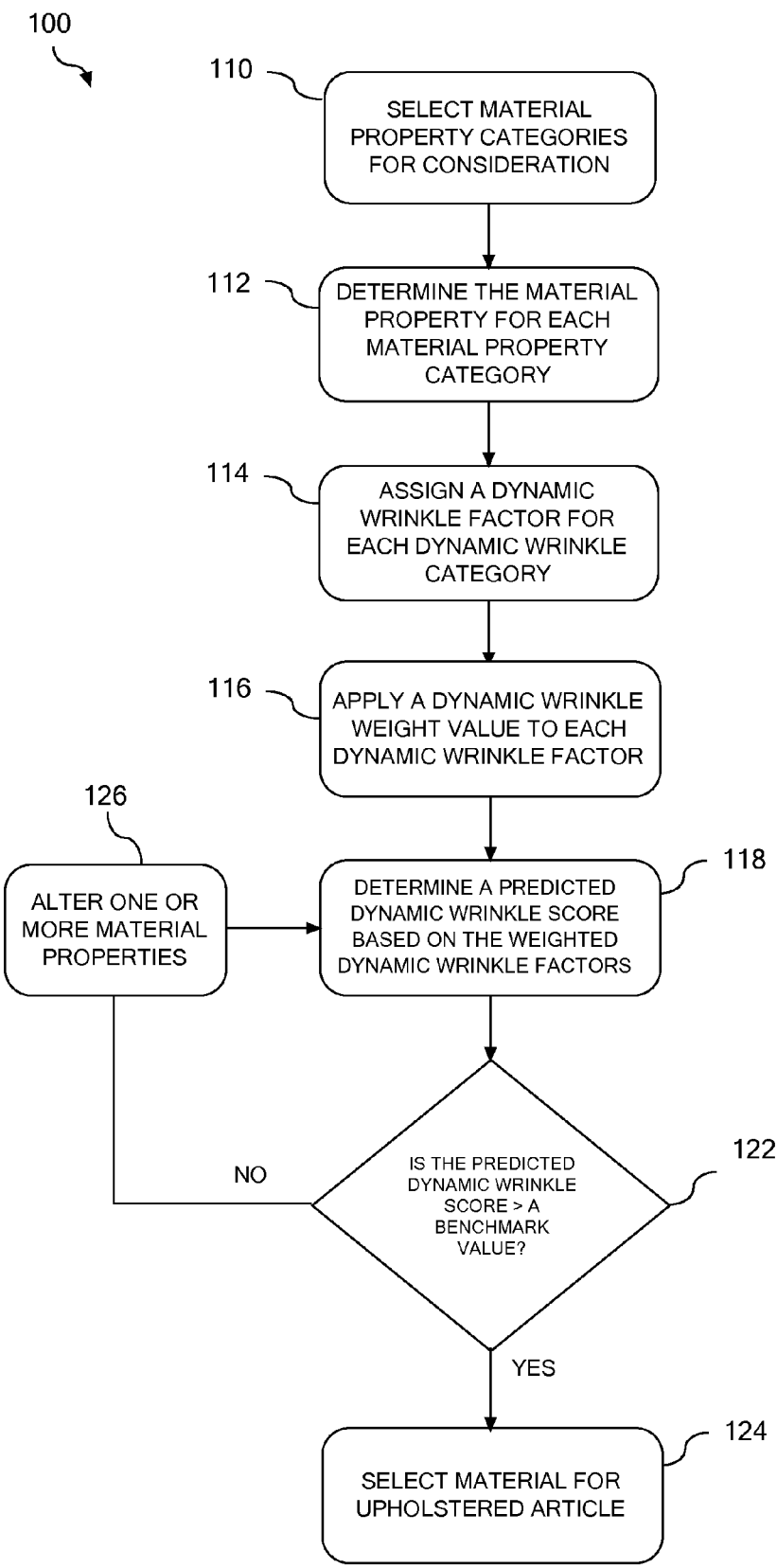
FIG. 1 depicts a schematic flowchart of an exemplary method of predicting a dynamic wrinkle property of a material according to one or more embodiments shown and described herein.

Referring to FIG. 1, a method of designing a material for an upholstered article by predicting a dynamic wrinkle property is illustrated in a flow chart 100. As illustrated in block 110, relevant material property categories may be initially selected. The categories may be predetermined or selected from a group of categories at the time of the analysis. The selected categories may have some level of impact on dynamic wrinkling. Material property categories may include, but are not limited to seat pattern design (i.e., seat trim pattern), seat foam hardness (ILD), seat foam density, material color, material construction, fabric scrim, pile, lamination thickness and density (lamination properties), constant load set, constant load elongation, Taber abrasion, surface abrasion, circular modulus, bending length, and stiffness/softness. All or some of the listed categories may be utilized in predicting the dynamic wrinkle property. Additionally, more categories not listed above may be utilized in accordance with embodiments described herein. Particular material property categories are generally described below.

The seat trim pattern category corresponds with the number of sew lines, which may affect how a seat wrinkles. An increased number of sew lines provides more areas where the material is tied down, which may make the material less likely to wrinkle and improve the dynamic wrinkle property. The seat foam hardness, or ILD (Indentation Load Deflection), is the capacity of the seat cushion foam to absorb and recover when a load is placed on it. A balanced ILD (hard enough for the seat to return to its normal shape after the load is removed and soft enough to provide comfort) may deliver improved dynamic wrinkle performance. Seat foam density may also play a role in designing a material that will pass a dynamic wrinkle evaluation test. Higher density seat foam material can improve dynamic wrinkle performance.

Fabric color may affect dynamic wrinkle performance because a darker color may tend to hide the appearance of wrinkles. The fabric construction category corresponds to whether a material is woven or knit. Generally, woven fabrics have low stretch but higher strengths than knit fabrics and may provide for increased wrinkle performance but may be difficult to apply over a seat frame. Fabric scrim, a thin layer of fabric, may be added to a material to reduce the stretch of the material, thus lowering the possibility of wrinkling. Additionally, fabrics with high pile may hide wrinkles that are present in the material.

The lamination properties of a material also impact the dynamic wrinkle property of the material. The lamination is a foam layer or layers attached to an underside of a material. The thicker the lamination the more the weight the material can absorb and not wrinkle. Like seat cushion foam density described above, the higher the lamination density, the more dynamic wrinkle performance may be improved.

Constant load set and elongation may be considered in predicting the results of a dynamic wrinkle evaluation test for a material. Constant load set may be measured in the warp, weft and bias directions. Constant load set measures how much a material stretches and then how closely it returns to its normal state after the stretch. A high constant load set in the warp, weft and/or bias directions may be indicative of a material that will wrinkle. Constant load elongation in the warp and weft directions measures how much a material stretches when a weight is applied thereto based on how far the material stretches from its original state. As with constant load set, the higher the constant load elongation value, the more a material may wrinkle.

Abrasion properties of a material may also be considered. Taber abrasion corresponds to a test that is indicative of how a face of a material reacts when abraded for a particular amount of time. Materials with a high Taber abrasion grade (resistance to abrasion) may lead to better dynamic wrinkle performance. Surface abrasion in both the warp and weft direction is how a base fabric of a material or back surface of a material react to abrasion over the life of the upholstered article. To determine surface abrasion, a fabric is abraded for a particular amount of time with an abradant. High surface abrasion grades are indicative of high dynamic wrinkle performance.

Circular modulus is a property that measures the stretching ability of a material in several directions. The more balanced the circular modulus property is among the stretch directions (e.g., weft, warp and bias), the better the dynamic wrinkling performance of the material may be. For example, a ratio of 1:1:1 for circular modulus properties in the weft, warp and bias directions is ideal. Bending length demonstrates how stiff a material is in the warp and weft directions. A material having a low bending length means that the material will be too soft with low durability, while a material having a high bending length may be too stiff and difficult to cut and apply to the upholstered article. A balanced bending length score may provide increased dynamic wrinkle performance. Further, stiffness/softness demonstrates how a fabric feels when it is pushed down and, similar to bending length, a more balance measurement between stiff and soft may yield improved dynamic wrinkle performance.

At block 112, a material property (or properties) for each material property category (e.g., those material property categories described above) may be determined. The material properties may be determined by evaluation procedures, testing, calculations, use of look-up tables, reference to material data sheets, or any other method. For example, a material under consideration may have a material property of 1.5 $Kg/m^3$ for the foam density category, which may have been determined from the material data sheet of the foam that is predicted to be used for the vehicle seat. In another example, the material property may be 1.9 $Kg/m^3$ for the lamination density category, "light" for the color category, or "high pile" for the fabric pile category (see Table 1 below).

A dynamic wrinkle factor may be assigned to each material property category at block 114. The dynamic wrinkle factors may be based at least in part on the material properties of the material associated with material property categories. The dynamic wrinkle factors may also be based on historical test results and statistical data. The dynamic wrinkle factors that are assigned may be within a dynamic wrinkle factor range, which may be from 1 to 5 with 5 being indicative of high or positive dynamic wrinkle performance and 1 being indicative of low or negative dynamic wrinkle performance, for example. As an example and not a limitation, historical data may show that the higher the taber abrasion property, the better the dynamic wrinkle performance. Conversely, a lower taber abrasion property (e.g., 3 or lower) may negatively affect the dynamic wrinkle performance. As another example, a dynamic wrinkle factor of 3.5 may be assigned to the construction category when the material is of a knit construction and a dynamic wrinkle factor of 4.0 when the material is of a woven construction.

At block 116, dynamic wrinkle weight values are applied to each dynamic wrinkle factor to generate a plurality of weighted dynamic wrinkle factors associated with the plurality of material property categories. The dynamic wrinkle weight values are based on the importance of the material property in the dynamic wrinkle analysis. Material properties that have a greater impact on dynamic wrinkle formation should have greater dynamic wrinkle weight values than those that have a lesser impact. In one embodiment, each dynamic wrinkle factor may be applied with the same dynamic wrinkle weight value. In another embodiment, the dynamic wrinkle weight values will be different for each dynamic wrinkle factor. As described below, the dynamic wrinkle weight values may also be selected based on the particular calculation utilized to determine the predicted dynamic wrinkle score. For example, the dynamic wrinkle weight factors may be selected to enable the predicted dynamic wrinkle score to be maintained within a desired range. In one embodiment, a summation of the dynamic wrinkle weight factors equals 1.0.

A predicted dynamic wrinkle score may be determined based on the weighted dynamic wrinkle factors at block 118. By developing the predicted dynamic wrinkle score using all of the weighted dynamic wrinkle factors, each material property is considered during the dynamic wrinkle property prediction analysis. Consideration of the relevant material properties in a single, objective score rather than subjectively considering individual material properties may provid a more accurate dynamic winkle prediction. In one embodiment, the predicted dynamic wrinkle score may be determined by adding all of the weighted dynamic wrinkle factors. Other calculations or formulas may also be utilized to achieve a normalized predicted dynamic wrinkle score. The score may be in a range defined by the method of calculating the score. For example, the predicted dynamic wrinkle score may be within the range of 1 to 5. A high score (e.g., a score of 5) indicates high dynamic wrinkle performance and a high likelihood that the material will pass the actual dynamic wrinkle evaluation test that is later into the vehicle design process.

At block 122, the predicted dynamic score may be compared with a benchmark value to determine whether the material meets defined standards and would likely pass the dynamic wrinkle evaluation test. As an example and not a limitation, in an embodiment where the predicted dynamic wrinkle score is a value between 1 and 5, a benchmark value may be 3.5, wherein a material having a predicted dynamic wrinkle score greater than or equal to 3.5 would pass the dynamic wrinkle prediction test and may be selected as the material for the upholstered article at block 124.

If the predicted dynamic wrinkle score is less than 3.5 at block 122, one or more of the material properties of the material may be altered at block 126. A predicted dynamic wrinkle score may then be recalculated at block 118 for a material comprising the altered property or properties and again compared to the benchmark values at block 120. This process may be repeated until a material having material property values that yield a predicted dynamic wrinkle score that is greater than or equal to the benchmark value is developed.

Figure 2:
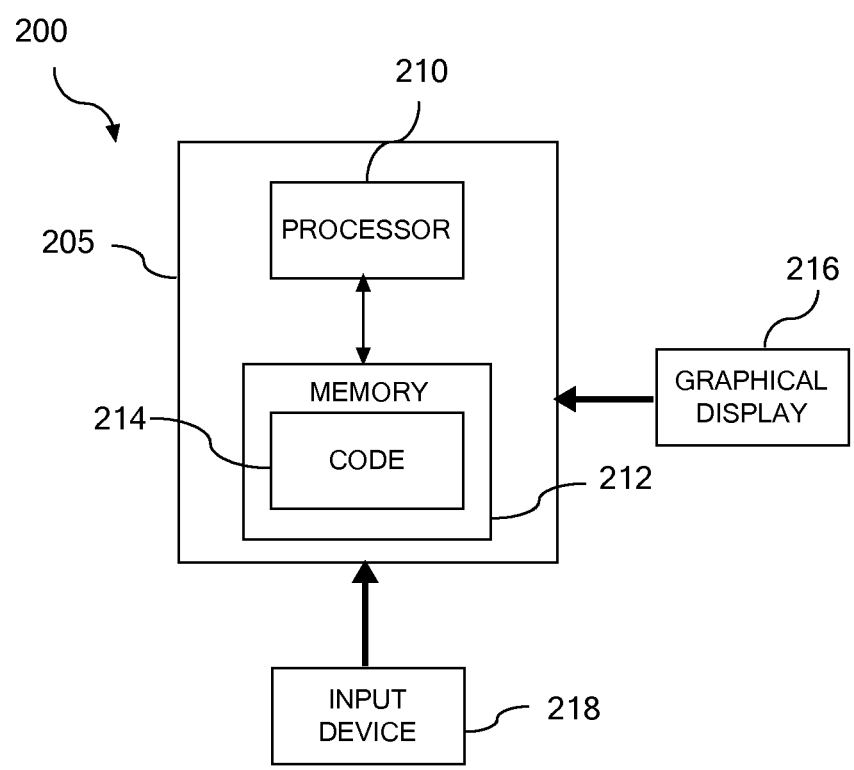
FIG. 2 depicts a schematic illustration of an exemplary dynamic wrinkle prediction system according to one or more embodiments shown and described herein.

FIG. 2 illustrates an exemplary dynamic wrinkle prediction system 200 of one embodiment. The system 200 comprises a computing device 205 having a processor 210 and a memory 212. Coupled to the computing device 205 may be a graphical display 216 and an input device 218. In one embodiment, the graphical display 216 and/or the input device 218 are integral components with the computing device 205 while in another embodiment the graphical display 216 and input device 218 are separate components. Further, in one embodiment, the graphical display 216 is configured as a touch screen graphical user interface capable of receiving user inputs. In this embodiment, the system 200 may not include an input device 218.

Residing in the memory 212 of the computing device 205 may be a set of executable instructions (e.g., program code 214) capable of instructing the processor 210 to perform programmed tasks. The program code 214 is operable to instruct the processor 210 to perform the dynamic wrinkle property prediction analysis as described above.

The system 200 may be used by a designer or engineer to develop a material to be used in the manufacture of an upholstered article, such as a vehicle seat. Table 1 provided below may be implemented in a user interface that may be displayed on the graphical display 216 of the system 200 illustrated in FIG. 2 by the processor 210 via the program code 214. It should be understood that the values and properties shown in Table 1 are for illustrative purposes only and do not represent actual values and/or properties of any particular material.

TABLE 1

| MATERIAL PROP. CATEGORY | MATERIAL PROPERTY | DYN. WRINKLE FACTOR | DYN. WRINKLE WEIGHT VALUE | WEIGHTED DYN. WRINKLE FACTOR |
| --- | --- | --- | --- | --- |
| Color | dark | 4 | 0.025 | 0.1 |
| Construction | woven | 4 | 0.087 | 0.42 |
| Scrim | no | 3.5 | 0.05 | 0.175 |
| Pile/No Pile | no pile | 3 | 0.06 | 0.21 |
| Lamination Thickness (mm) | 5 mm | 4.5 | 0.03 | 0.135 |
| Lamination Density (kg/m$^3$) | 1.7 | 3.5 | 0.03 | 0.105 |
| Constant Load Set - warp (%) | 0.8 | 4 | 0.053 | 0.212 |
| Constant Load Set - weft (%) | 1.6 | 4 | 0.053 | 0.212 |

TABLE 1-continued

| MATERIAL PROP. CATEGORY | MATERIAL PROPERTY | DYN. WRINKLE FACTOR | DYN. WRINKLE WEIGHT VALUE | WEIGHTED DYN. WRINKLE FACTOR |
|---|---|---|---|---|
| Constant Load Set - bias (%) | 3 | 2.5 | 0.053 | 0.1325 |
| Constant Load Elong. - warp (%) | 5.2 | 2.5 | 0.053 | 0.1325 |
| Constant Load Elong. - weft (%) | 12.3 | 3 | 0.053 | 0.159 |
| Taber Abrasion (grade) | 3 | 2.5 | 0.055 | 0.1375 |
| Surface Abrasion - warp (grade) | 3 | 2.5 | 0.05 | 0.2 |
| Surface Abrasion - weft (grade) | 3 | 2.5 | 0.055 | 0.2 |
| Circ. Mod. - warp (N) | 139 | 2 | 0.044 | 0.1 |
| Circ. Mod. - weft (N) | 34 | 2 | 0.05 | 0.1 |
| Circ. Mod. - bias (N) | 20 | 2 | 0.03 | 0.1 |
| Bending Length - warp (mm) | 28 | 0 | 0.064 | 0 |
| Bending Length - weft(mm) | 61 | 0 | 0.052 | 0 |
| Stiffness/Softness (N) | 26 | 3 | 0.053 | 0.159 |
| Predicted Dynamic Wrinkle Score | | | | 2.990 |

The designer may select an initial material based on design requirements and previous knowledge of materials that may be appropriate for the particular vehicle seat design. In one embodiment, a plurality of materials may be stored within the memory 212 of the system such that when the designer selects the initial material that he or she wishes to start with, the material properties of the selected initial material may be automatically populated into the MATERIAL PROPERTY column of the user interface 300. The programmed material property data associated with each material stored within the memory 212 may be taken from material data sheets, historical testing data, previous experience, or other sources. The programmed material property data may be modified and stored for future use. Further, the material property categories provided in the MATERIAL PROPERTY CATEGORY may be modified by the addition and/or subtraction of material property categories. For example, a "denier" category may be added to those categories provided in Table 1. The particular categories of interest may depend on the particular application in which a material is being designed.

The designer may decide to change one or more of the programmed material properties associated with the selected material for the instant material design by modifying the values located in the MATERIAL PROPERTY column. In one embodiment, each material property field or cell may comprise a drop down list so that the designer may select the appropriate value for the material property of the particular material property category. For example, the field for "Pile" may have a drop down list that includes "high pile," "low pile" and "no pile" from which the designer may select the appropriate value.

A dynamic wrinkle factor may be automatically assigned to each material property in the DYNAMIC WRINKLE FACTOR column based on the material property values present in the MATERIAL PROPERTY column. The assignment of appropriate dynamic wrinkle factors may be based on historical or statistical data as described above. In the illustrated embodiment, the dynamic wrinkle factor may be a value between 1 and 5, wherein a value of 5 is indicative of high dynamic wrinkle performance and a value of 1 is indicative of a low dynamic wrinkle performance. As an example, the dynamic wrinkle factor assigned to the 5 mm lamination thickness in Table 1 is a value of 4.5, which is indicative of high dynamic wrinkle performance based on historical data. For example, if the lamination thickness was entered as 3 mm, a dynamic wrinkle factor of 3.5 may be automatically assigned because historical data may suggest that a thinner lamination thickness provides a lower dynamic wrinkle performance. The dynamic wrinkle factors that are automatically populated by the processor 210 may be overridden by the designer by modifying one or more of the populated values.

Still referring to Table 1, the DYNAMIC WRINKLE WEIGHT VALUE column comprises a plurality of dynamic wrinkle weight values that correspond to the plurality of material property categories. The dynamic wrinkle weight values are applied to the dynamic wrinkle factors in the DYNAMIC WRINKLE FACTOR column in accordance with the importance of each material property category in the determining the predicted dynamic wrinkle score (e.g., by multiplication). The weight values may be automatically populated in the DYNAMIC WRINKLE WEIGHT VALUE column according to default values that are based on historical and/or statistical data. It should be understood that dynamic wrinkle weight values provided in Table 1 are for illustrative purposes only. The weight factors may be any value, and may be the same for each material property category. The weight factors may be determined based on the methodology of calculating the predicted dynamic wrinkle score, the number of material property categories under consideration, the type of material property categories under consideration, the interaction between particular material property categories under consideration in the dynamic wrinkle prediction, and other factors. As stated above, in one embodiment a summation of the dynamic wrinkle weight factors equals 1.0.

The weighted dynamic wrinkle factors are provided in the WEIGHTED DYNAMIC WRINKLE FACTOR column of Table 1. As described above, the weighted dynamic wrinkle factors are utilized to determined the predicted dynamic wrinkle score. In the illustrated embodiment, the weighted dynamic wrinkle factors are summed to generate the predicted dynamic wrinkle score. The predicted dynamic wrinkle score calculation is not limited to a summation of the weighted dynamic wrinkle factors.

As described above, the material property values of the material under consideration may be altered to achieve a predicted dynamic wrinkle score that is greater than or equal to a benchmark value. A material that achieves such a score may then be selected as the material for the upholstered article and then subjected to the dynamic wrinkle evaluation test later in the design process.

It should now be understood that the methods and systems shown and described herein may be used to accurately determine a predicted dynamic wrinkle score that is indicative of the likelihood that a material will pass a subsequent dynamic wrinkle evaluation test on an upholstered article. By considering a plurality of material properties in conjunction with one another, an accurate predicted dynamic wrinkle score may be determined. Moreover, the methods and systems shown and described herein provide designers with tools to quickly and efficiently design a suitable material for use with an upholstered article early in the design process, thereby significantly saving development time and resources.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of predicting a dynamic wrinkle property of a material for incorporation with an upholstered article comprising:
    selecting a plurality of material property categories;
    determining a material property for each selected material property category of a material;
    assigning a dynamic wrinkle factor for each material property category based at least in part on the material property associated with the material property category;
    applying a dynamic wrinkle weight value to each dynamic wrinkle factor to generate a weighted dynamic wrinkle factor for each material property category;
    determining a predicted dynamic wrinkle score based at least in part on the weighted dynamic wrinkle factors; and
    altering one or more material properties of the material if the predicted dynamic wrinkle score is below a benchmark value.

2. The method of claim 1 wherein determining the predicted dynamic wrinkle score further comprises summing the weighted dynamic wrinkle factors.

3. The method of claim 1 wherein the dynamic wrinkle factors are within a dynamic wrinkle factor range.

4. The method of claim 1 wherein a summation of the dynamic wrinkle weight values is equal to 1.0.

5. The method of claim 1 wherein the dynamic wrinkle factor for each material property category corresponds to a positive, neutral or negative dynamic wrinkle performance based on historical data.

6. The method of claim 1 wherein the material property categories comprise two or more of the following: seat pattern design, seat foam hardness, seat foam density, material color, material construction, fabric scrim, pile, lamination thickness, lamination density, constant load set, constant load elongation, Taber abrasion, circular modulus, bending length, and stiffness/softness.

7. The method of claim 1 wherein the material property categories include: seat pattern design, seat foam hardness, seat foam density, material color, material construction, fabric scrim, pile, lamination thickness, lamination density, constant load set, constant load elongation, Taber abrasion, circular modulus, bending length, and stiffness/softness.

8. A method of designing a material of an upholstered article comprising:
    providing a material;
    predicting a dynamic wrinkle property of the material by performing a dynamic wrinkle property prediction analysis, the dynamic wrinkle property prediction analysis comprising:
        selecting two or more material property categories from a plurality of material property categories associated with the material;
        determining a material property for each selected material property category;
        assigning a dynamic wrinkle factor for each selected material property category based at least in part on the material property associated with the selected material property category;
        applying a dynamic wrinkle weight value to each dynamic wrinkle factor to generate a weighted dynamic wrinkle factor for each selected material property category; and
        determining a predicted dynamic wrinkle score based at least in part on the weighted dynamic wrinkle factors; and
    comparing the predicted dynamic wrinkle score with a predicted dynamic wrinkle score benchmark value;
    altering one or more material properties and performing the dynamic wrinkle property prediction analysis for a material with the altered material properties if the predicted dynamic wrinkle score is less than the predicted dynamic wrinkle score benchmark value; and
    selecting the material if the predicted dynamic wrinkle score is greater than or equal to the predicted dynamic wrinkle score benchmark value.

9. The method of claim 8 further comprising performing a dynamic wrinkle evaluation test of the selected material.

10. The method of claim 8 wherein determining the predicted dynamic wrinkle score further comprises summing the weighted dynamic wrinkle factors.

11. The method of claim 8 wherein the dynamic wrinkle factors are within a dynamic wrinkle factor range.

12. The method of claim 8 wherein a summation of the dynamic wrinkle weight values is equal to 1.0.

13. The method of claim 8 wherein the dynamic wrinkle factor for each material property category corresponds to a positive, neutral or negative dynamic wrinkle performance based on historical data.

14. The method of claim 8 wherein the material property categories comprise: seat pattern design, seat foam hardness, seat foam density, material color, material construction, fabric scrim, pile, lamination thickness, lamination density, constant load set, constant load elongation, Taber abrasion, circular modulus, bending length, and stiffness/softness.

15. A dynamic wrinkle prediction system comprising:
    a processor;
    a graphical display; and
    a memory, wherein the memory comprises a set of executable instructions operable to cause the processor to:
        receive a plurality of material properties associated with a material, the plurality of material properties corresponding to a plurality of material property categories;
        assign a dynamic wrinkle factor for each material property category based at least in part on the material property associated with the material property category;
        apply a dynamic wrinkle weight value to each dynamic wrinkle factor to generate a weighted dynamic wrinkle factor for each material property category;
        determine a predicted dynamic wrinkle score based at least in part on the weighted dynamic wrinkle factors; and
        display the predicted dynamic wrinkle score on the graphical display.

16. The dynamic wrinkle prediction system of claim 15 wherein determining the predicted dynamic wrinkle score further comprises summing the weighted dynamic wrinkle factors.

17. The dynamic wrinkle prediction system of claim 15 wherein the dynamic wrinkle factors are within a dynamic wrinkle factor range.

18. The dynamic wrinkle prediction system of claim 15 wherein a summation of the dynamic wrinkle weight values is equal to 1.0.

19. The dynamic wrinkle prediction system of claim 15 wherein the dynamic wrinkle factor for each material property category corresponds to a positive, neutral or negative dynamic wrinkle performance based on historical data.

20. The dynamic wrinkle prediction system of claim 15 wherein the material property categories include: seat pattern design, seat foam hardness, seat foam density, material color, material construction, fabric scrim, pile, lamination thickness, lamination density, constant load set, constant load elongation, Taber abrasion, circular modulus, bending length, and stiffness/softness.

* * * * *